United States Patent
Lee et al.

(10) Patent No.: US 6,806,570 B1
(45) Date of Patent: Oct. 19, 2004

(54) THERMAL COMPLIANT SEMICONDUCTOR CHIP WIRING STRUCTURE FOR CHIP SCALE PACKAGING

(75) Inventors: Jin-Yuan Lee, Hsin-chu (TW); Eric Lin, Hsin-chu (TW)

(73) Assignee: Megic Corporation, Hsin-Chu (TW)

( * ) Notice: Subject to any disclaimer, the term of this patent is extended or adjusted under 35 U.S.C. 154(b) by 0 days.

(21) Appl. No.: 10/279,267

(22) Filed: Oct. 24, 2002

(51) Int. Cl.⁷ .............................................. H01L 21/44
(52) U.S. Cl. .................... 257/737; 257/738; 257/778
(58) Field of Search ............................... 257/737, 738, 257/778

(56) References Cited

U.S. PATENT DOCUMENTS

| | | | |
|---|---|---|---|
| 5,602,422 A | * | 2/1997 | Schueller et al. ........... 257/738 |
| 5,943,597 A | | 8/1999 | Kleffner et al. ............. 438/613 |
| 6,028,364 A | | 2/2000 | Ogino et al. ................. 257/778 |
| 6,064,576 A | * | 5/2000 | Edwards et al. ............ 361/776 |
| 6,394,819 B1 | | 5/2002 | Mosser, III et al. .......... 438/83 |
| 6,503,777 B2 | * | 1/2003 | Jackson ...................... 438/106 |

* cited by examiner

Primary Examiner—Roy Potter
(74) Attorney, Agent, or Firm—George O. Saile; Stephen B. Ackerman; Rosemary L. S. Pike

(57) ABSTRACT

A thermally compliant multi-layer wiring structure on a semiconductor chip is described. The multi-layer wiring structure incorporates an "empty" or air gap under the interconnect wiring and does not allow any thermally induced strains to be transmitted to the interconnecting solder balls. This design is to be used in chip scale packaging applications where printed circuit technology is used as the next level of package.

20 Claims, 4 Drawing Sheets

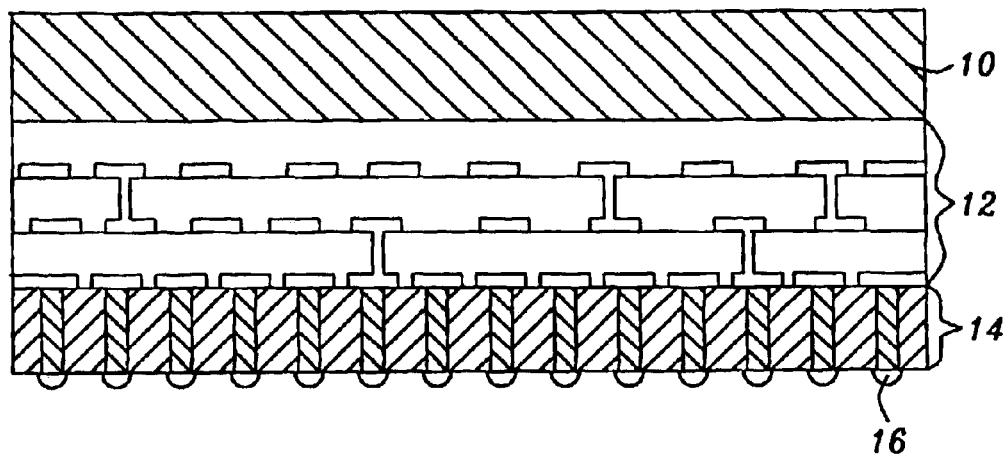
FIG. 1 – Prior Art
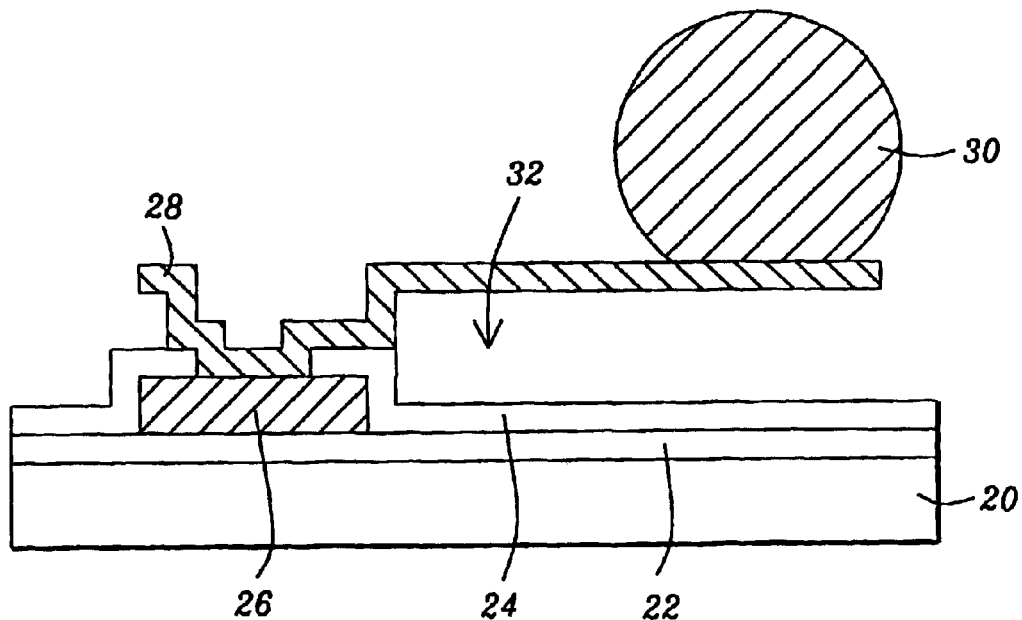
FIG. 2

THERMAL COMPLIANT SEMICONDUCTOR CHIP WIRING STRUCTURE FOR CHIP SCALE PACKAGING

FIELD OF THE INVENTION

The present invention relates in general to the integrity and reliability of semiconductor chip interconnections, more specifically to the design of multi-layer wiring structures for relieving thermal stresses on solder ball interconnections.

BACKGROUND OF THE INVENTION

The following three U. S. Patents relate to the design of semiconductor devices with thermal stress relief.

U.S. Pat. No. 5,943,597 dated Aug. 24, 1999, issued to J. H. Kleffner et. al. shows a design for providing stress relief to a solder bumped semiconductor chip by forming a trench that surrounds the individual solder bumps.

U.S. Pat. No. 6,028,364 dated Feb. 22, 2000, issued to M. Ogino et. al. describes a design utilizing an elastomer for thermal stress relief on a bumped semiconductor chip.

U.S. Pat. No. 6,394,819 B1 dated May 28, 2002, issued to B. H. Mosser, III et. al. discloses a design where a dielectric member is used between electrical components to absorb thermal stresses.

The advent of VLSI technology in the semiconductor field has resulted in the demand for high density packaging. Semiconductor packaging traditionally has three levels of package. The first level, a single chip module is made up of a semiconductor chip attached to a substrate that includes interconnections to the next level of package. The substrate and chip assembly is usually molded in an encapsulant for environmental protection. The second level of package, usually a printed circuit card mounts and interconnects the single chip modules and has a connector system to the third level package, usually a planar printed circuit board.

The utilization of VLSI semiconductor chips in commercial electronic products such as cameras, camcorders, DVD players, etc., has demanded that semiconductor packages be highly reliable and space efficient in their designs. In addition military applications require lightweight, space efficient, highly reliable packaging structures.

Elimination of a level of package has been a driving force in electronic system design in the recent past. This reduction in packaging level would allow for closer spacing of semiconductor chips thereby reducing signal delay times. In addition the reduction of a level of package would increase product reliability and decrease product costs. One design currently in use is direct chip attach. In this design chips are flip chip mounted onto a substrate, usually ceramic, and the assembly sealed in an enclosure for environmental protection. The environmental protection is required to protect the semiconductor and the interconnections against corrosive elements and mechanical disturbances. The inclusion of enclosures for environmental protection results in larger packages with longer distances between semiconductor chips and thereby longer signal delays.

In addition, advances in VLSI technology in the semiconductor field has created the need for higher interconnection density on the surface of the semiconductor chip. These interconnections are used to connect the chip terminals to the next level of package or printed circuit board. The need for higher density interconnections results from the smaller circuit devices fabricated by the recent manufacturing advances. The smaller circuits in turn result in higher circuit counts per chip. The higher circuit count requires more signal input, and signal output connections; in addition the higher circuit count requires more power to be delivered to the chip requiring more power connections. This need for higher interconnection density has resulted in interconnection techniques such as solder bumps that are capable of utilizing the total area of the chip thus providing more interconnections per chip.

The reliability of solder bump interconnects in chip scale packaging that utilizes solder ball interconnections and epoxy printed circuit technology for the next level of package, needs to address the problem of thermally induced mechanical stresses. The mechanical stresses in the solder bump result from mechanical strains induced by the difference in the thermal coefficient of expansion (TCE) of the basic materials used, and the temperature changes the packages are exposed to during product use.

In the application where the product utilizes a silicon semiconductor chip and the next level of package is an epoxy—glass printed circuit card and the product usage is in a home or office environment, the resultant thermally induced strains are such that the solder of the solder bumps is stressed beyond the elastic limit of the material. In the plastic range of ductile materials such as solder fatigue cracks develop due to the on—off thermal cycles during product usage. These fatigue cracks are a reliability concern as they eventually result in faulty interconnections.

In order to the thermal stresses on the solder ball interconnections a method currently in use is shown in FIG. 1 (prior art) The semiconductor chip 10 with circuits has a interconnecting wiring structure 12 fabricated by conventional photolithography as shown. The wiring structure 12 is composed of copper Cu or aluminum Al metallurgy and a low expansion polyimide for the insulator. A buffer layer 14 is added to the above structure by soldering or pressure metal bonding the interconnections. Solder balls are added by plating or evaporation. The buffer layer composed low modulus elastomer with thru metal vias for interconnections, provides the stress relief required when the chip scale package is interconnected to the next level package.

The drawbacks to this method of utilizing chip scale packaging directly mounted on printed circuit boards is the additional processes required to add the buffer layer, and the additional electrical delay.

SUMMARY OF THE INVENTION

Accordingly it is an object of one or more embodiments of the present invention to provide a multi-layer wiring structure on a semiconductor chip that has the ability to reduce or eliminate the thermally induced mechanical stresses on the solder ball terminals.

It is a further object of one or more embodiments of the present invention that the reduction of the thermal stresses allows for the use of the chip scale package to be directly mounted to a printed circuit interconnect.

Another object of the present invention is that the structure design utilize materials and fabrication processes currently used in semiconductor manufacture.

It is a further object of the present invention that the semiconductor chip with the thermal compliant multi-layered wiring structure can be used in high thermal cycled products with resultant high reliability.

The above objectives are achieved by one or more embodiments of the present invention by providing a multi-layered wiring structure on a semiconductor chip that utilizes interconnect metallurgy and solder balls that are not directly in contact with the supporting dielectric material. The "empty" or air gap under the interconnect metallurgy and solder balls results in a compliant structure that does not transmit thermally induced stresses to the solder ball.

An embodiment of the present invention shown in FIG. 2 wherein the cross-sectional view shows a typical solder ball multi-layer wiring structure fabricated on a semiconductor wafer 20. The semiconductor wafer 20 has a dielectric layer 22, a passivation layer 24, and interconnecting metal pads 26, fabricated on its surface. A metal wiring line 28 is fabricated in a method that allows the metal line 28 not to be in contact with any material on the semiconductor wafer. A solder ball 30 is then fabricated at the end of the wiring line 28. The resultant structure with the "empty" or air gap 32 is totally compliant and does not transmit any thermally induced stresses to the solder ball.

A second, third, fourth, and fifth embodiment of the present invention is shown in FIGS. 3, 4, 5, and 6 respectively. In these embodiments the "empty" or air gap under the wiring line is enclosed on two sides and varies in size, location and shape to allow for different design applications.

The sixth embodiment of the present invention is shown in FIG. 7 and in FIG. 8. In FIG. 7 a cross section of the interconnect metallurgy is shown composed of 5 um thick copper Cu 36 and 5 um thick nickel Ni 34. The top view of the interconnect metallurgy is shown in FIG. 8. This configuration has an "empty" or air gap in the copper line 36 under the solder ball 30 and it provides the required compliance for relieving thermally induced stresses.

BRIEF DESCRIPTION OF THE DRAWINGS

The present invention will be more clearly understood from the following description taken in conjunction with the accompanying drawings in which like reference numerals designate similar or corresponding elements, regions and portions and in which:

FIG. 1 is a cross section of the prior art showing a semiconductor chip utilizing an elastomer as a compliant member.

FIG. 2 is a cross sectional view of the first embodiment of the present invention.

DETAILED DESCRIPTION OF THE PREFERRED EMBODIMENT

The demands of electronic products for highly space efficient and reliable components has resulted in the development of semiconductor chip packaging designs that are compact and cost efficient. One of these designs eliminates the level of package by directly mounting the semiconductor chip onto a printed circuit card or printed circuit board. This packaging design is widely know as chip scale packaging.

In chip scale packaging the semiconductor chip is molded in a plastic encapsulant while allowing the front face of the chip to be utilized for interconnections to the next level of package. Generally these interconnections are an array of solder balls that are used for input-output signals and power connections to the semiconductor chip. The solder balls are metallurgically bonded to the next level of package during assembly.

A drawback to the chip scale packaging design is that the basic materials used, silicon for the semiconductor chip, and glass-epoxy for the printed circuit cards and boards, have different thermal coefficients of expansion TCE. The TCE for silicon based materials ranges from 2.5–3.5 ppm/° C. whereas the TCE for glass-epoxy structures is in the range of 15–25 ppm/° C. This difference in the TCE results in thermally induced stresses in the solder ball interconnections when the product is in use.

The stresses in the solder ball interconnections are due to the thermally induced strains when the product is thermally cycled during use. The strain on the interconnecting solder balls is reduced or eliminated by the embodiments of the present invention. This is accomplished by the design of the multi-layer wiring structure on the semiconductor chip in a manner that does not allow the thermally induced strain to be transmitted to the interconnecting solder ball.

The multi-layer wiring structure incorporates an "empty" or air gap under the metal interconnection wiring. This design provides an elastic structure that is ductile by design so that it will not transmit the thermally induced strain to the interconnecting solder balls.

The first embodiment of the present invention FIG. 2 incorporates a multi-layer wire structure that has an "empty" or air gap 32 under the wiring that connects the solder ball 28 to the semiconductor circuits 26. Any thermally induced strain that will result in stresses on the solder ball is mitigated in the wiring line 28.

Figure 3:
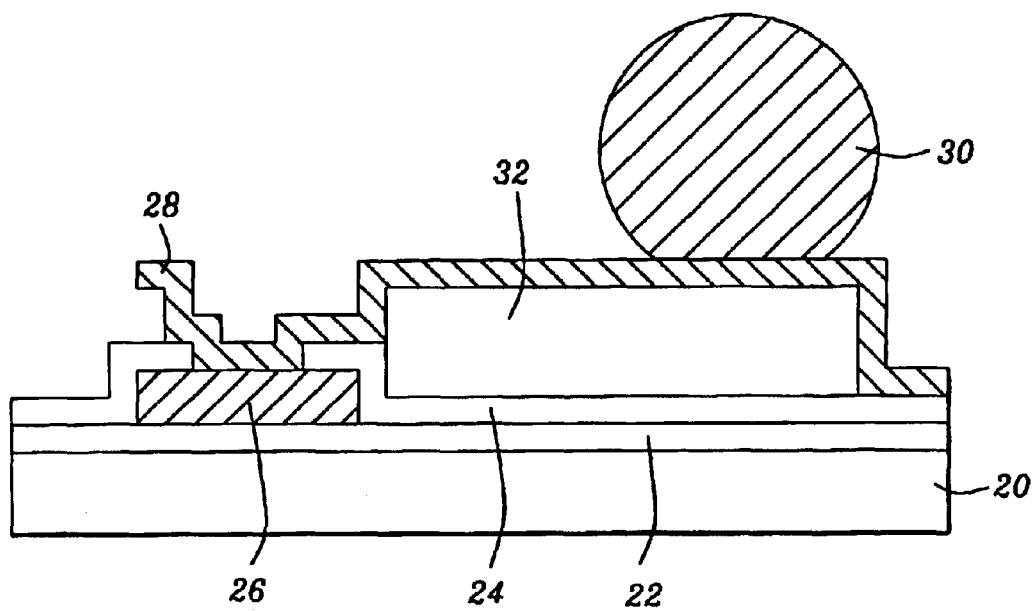
FIG. 3 is a cross sectional view of the second embodiment of the present invention.

The second embodiment of the present invention FIG. 3 utilizes a box like structure with an "empty" or air gap 32 under the wiring line 28 that interconnects the chip circuits to the solder balls 30. The structure due to its design is resilient and does not transmit any thermally induced stresses to the solder ball.

Figure 4:
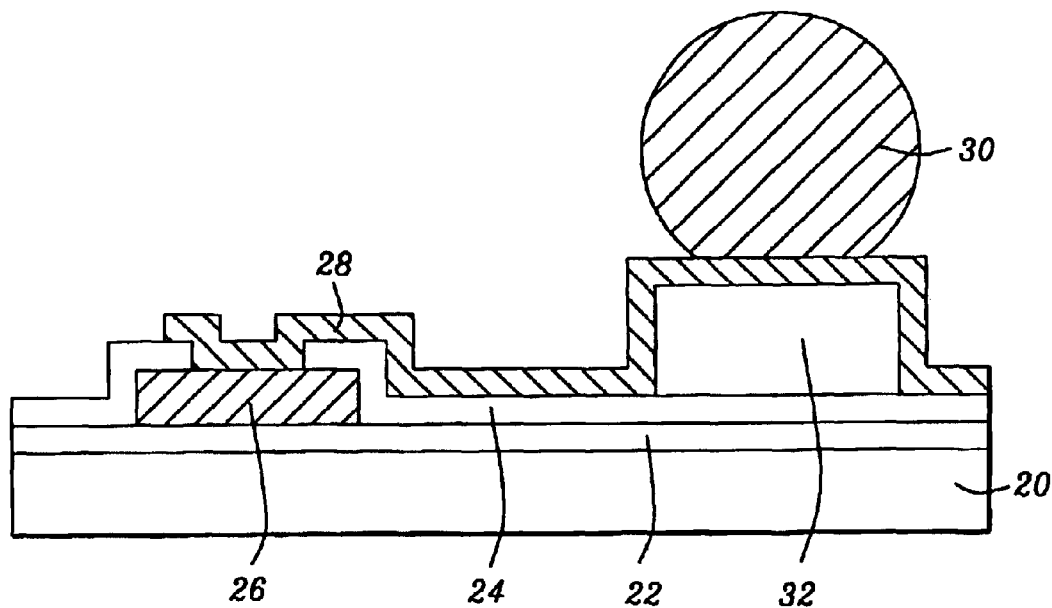
FIG. 4 is a cross sectional view of the third embodiment of the present invention.

The third embodiment of the present invention FIG. 4 provides a smaller box like structure formed by the "empty" or air gap 32 and the wiring 28. This structure may be used in semiconductor chip designs that require high circuit density.

Figure 5:
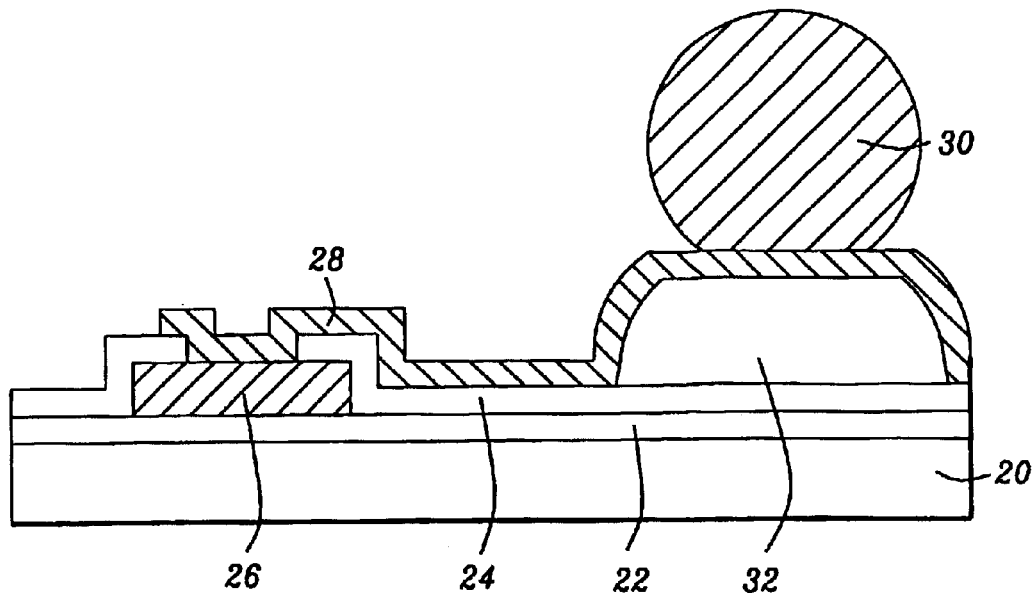
FIG. 5 is a cross sectional view of the fourth embodiment of the present invention.

The fourth embodiment of the present invention FIG. 5 utilizes a rounded shaped "empty" or air gap 32 under the wiring to the solder ball 28.

Figure 6:
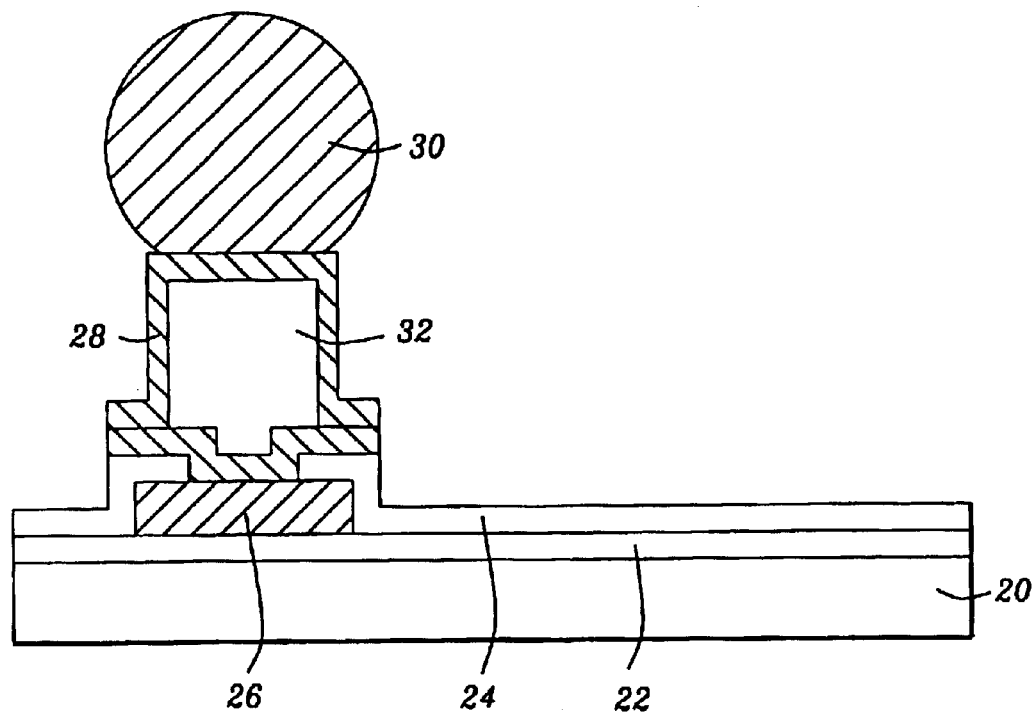
FIG. 6 is a cross sectional view of the fifth embodiment of the present invention.

The fifth embodiment of the present invention FIG. 6 allows for the placement of the "empty" or air gap 32 to be placed on top of the interconnecting pad 26. This highly resilient structure allows for minimum semiconductor chip space to be used for the "empty" or air gap.

Figure 7:
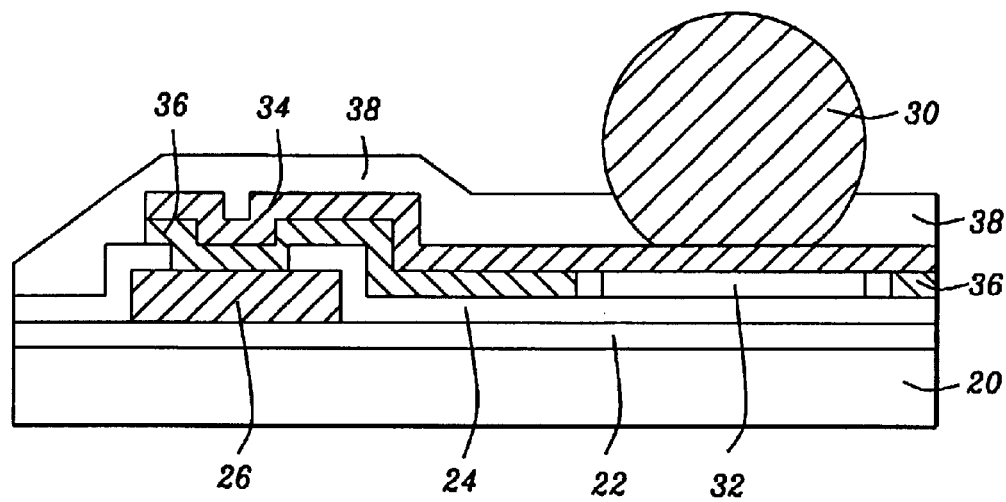
FIG. 7 is a cross sectional view of the sixth embodiment of the present invention.
Figure 8:
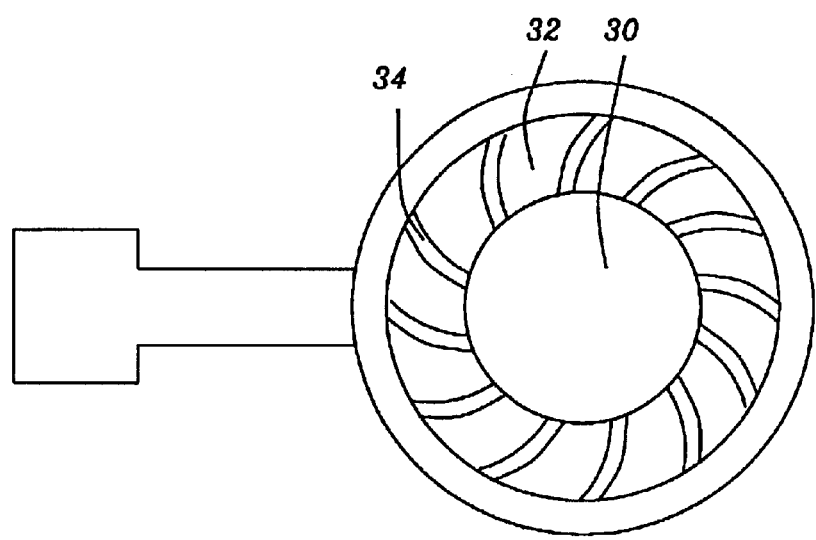
FIG. 8 is a top view of the interconnect wiring of the sixth embodiment of the present invention.

The sixth embodiment of the present invention shown in FIG. 7 and FIG. 8 uses interconnect metallurgy composed of copper 36 and nickel 34. The "empty" or air gap is incorporated in the copper metallurgy 36 placed under the solder ball. This provides a structure that has the capability to relieve the thermally induced stresses.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A semiconductor chip multi-layer wiring structure comprising:
   a wiring layer interconnecting semiconductor circuit terminals to output terminals;
   solder ball terminals on said wiring layer used to interconnect said semiconductor chip to a wiring substrate; and
   an "empty" or air gap underlying said wiring layer underlying said solder ball terminals;
   wherein said "empty" or air gap provides a low strength buffer layer for absorbing thermally induced stresses between said semiconductor chip and said wiring substrate.

2. The semiconductor chip multi-layer wiring structure of claim 1 wherein said "empty" or air gap is enclosed on two sides by said wiring layer.

3. The semiconductor chip multi-layer wiring structure of claim 1 wherein said "empty" or air gap is located on top of said semiconductor circuit terminal and between said semiconductor circuit terminal and said wiring layer underlying said solder ball terminals.

4. The semiconductor chip multi-layer wiring structure of claim 1 wherein said wiring layer is designed to deflect and to absorb thermally induced stresses between said semiconductor chip and said wiring substrate.

5. The semiconductor chip multi-layer wiring structure of claim 1 wherein said wiring layer between said semiconductor circuit terminal and said solder ball terminal has a barrier layer composed of titanium Ti, Titanium/Tungsten Ti/W, Titanium/Nickel Ti/Ni, or Chromium Cr.

6. The semiconductor chip multi-layer wiring structure of claim 1 further comprising a dielectric layer underlying said semiconductor circuit terminal wherein said "empty" or air gap is fully enclosed by said dielectric layer and said wiring layer.

7. The semiconductor chip multi-layer wiring structure of claim 1 wherein said "empty" or air gap has a width greater than or equal to a width of said solder ball terminal.

8. The semiconductor chip multi-layer wiring structure of claim 1 wherein the said wiring layer between said semiconductor circuit terminal and said solder ball terminal has a seed layer comprised of Gold Au, Copper Cu, or Nickel Ni alloy.

9. The semiconductor chip multi-layer wiring structure of claim 1 wherein said wiring layer between said semiconductor circuit terminal and said solder ball terminal is composed of a layer of Nickel Ni having a thickness of from 0.5 um to 20 um.

10. The semiconductor chip multi-layer wiring structure of claim 1 wherein said wiring layer between semiconductor circuit terminal and said solder ball terminal is composed of a layer of Copper Cu or Gold Au having a thickness of from 0.1 um to 20 um and a layer of Nickel Ni having a thickness of from 0.5 um to 20 um.

11. The semiconductor chip multi-layer wiring structure of claim 10 wherein said "empty" or air gap under said solder ball is located in said Copper Cu portion of the wiring layer.

12. The semiconductor chip multi-layer wiring structure of claim 1 wherein said wiring layer between said semiconductor circuit terminal and said solder ball is composed of a layer of Nickel Ni having a thickness of from 0.5 um to 20 um, and a thin layer of Gold Au having a thickness of from 0.025 um to 0.2 um.

13. A semiconductor chip multi-layer wiring structure comprising:
   a wiring layer interconnecting semiconductor circuit terminals to output terminals; and
   solder ball terminals on said wiring layer used to interconnect said semiconductor chip to a wiring substrate
   wherein said wiring layer has a perforated pattern forming an "empty" or air gap underlying said solder ball terminals wherein the circumferential area of the said "empty" or air gap is partially enclosed by said wiring layer and wherein said "empty" or air gap provides a low strength buffer layer for absorbing thermally induced stresses between said semiconductor chip and said wiring substrate.

14. The semiconductor chip multi-layer wiring structure of claim 13 wherein the total top area of the "empty" or air gap is a perforated pattern of arced radial fingers.

15. A semiconductor chip multi-layer wiring structure comprising:
   a plurality of interconnected semiconductor device structures having metal pads in a topmost layer;
   a dielectric layer overlying said metal pads having openings therein exposing said metal pads;
   a wiring layer connecting said metal pads to output terminals;
   solder ball terminals on said wiring layer used to interconnect said metal pads to a wiring substrate; and
   an "empty" or air gap underlying or within said wiring layer underlying said solder ball terminals
   wherein said "empty" or air gap provides a low strength buffer layer for absorbing thermally induced stresses between said semiconductor chip and said wiring substrate.

16. The semiconductor chip multi-layer wiring structure of claim 15 wherein said "empty" or air gap underlies said wiring layer and is enclosed on two sides by said wiring layer.

17. The semiconductor chip multi-layer wiring structure of claim 15 wherein said "empty" or air gap underlies said wiring layer and is located on top of each of said metal pads and between each of said metal pads and said wiring layer underlying said solder ball terminals.

18. The semiconductor chip multi-layer wiring structure of claim 15 wherein said "empty" or air gap underlies said wiring layer and is fully enclosed by said dielectric layer and said wiring layer.

19. The semiconductor chip multi-layer wiring structure of claim 15 wherein said "empty" or air gap is within said wiring layer wherein said wiring layer has a perforated pattern forming said "empty" or air gap underlying said solder ball terminals wherein the circumferential area of said "empty" or air gap is partially enclosed by said wiring layer.

20. The semiconductor chip multi-layer wiring structure of claim 19 wherein the total top area of the "empty" or air gap is a perforated pattern of arced radial fingers.

* * * * *